United States Patent
Angell et al.

(10) Patent No.: US 6,268,226 B1
(45) Date of Patent: Jul. 31, 2001

(54) REACTIVE ION ETCH LOADING MEASUREMENT TECHNIQUE

(75) Inventors: David Angell, Poughkeepsie, NY (US); Stuart M. Burns, Brookfield, CT (US); Waldemar W. Kocon, Wappingers Falls; Michael L. Passow, Pleasant Valley, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/345,647

(22) Filed: Jun. 30, 1999

(51) Int. Cl.⁷ .................................................. H01L 21/00
(52) U.S. Cl. ........................... 438/16; 438/14; 438/706; 438/712; 438/719; 216/59; 216/60
(58) Field of Search ............................... 438/14, 16, 706, 438/712, 719; 216/59, 60

(56) References Cited

U.S. PATENT DOCUMENTS

| | | | |
|---|---|---|---|
| 5,288,367 | * | 2/1994 | Angell et al. .................. 156/626 |
| 5,399,229 | * | 3/1995 | Stefani et al. .................. 156/626 |
| 5,576,629 | * | 11/1996 | Turner et al. .................. 324/709 |
| 5,629,772 | | 5/1997 | Ausschnitt . |
| 5,658,423 | * | 8/1997 | Angell et al. .................. 438/9 |
| 5,757,507 | | 5/1998 | Ausschnitt et al. . |
| 5,773,315 | * | 6/1998 | Jarvis .................. 438/14 |
| 5,822,219 | * | 10/1998 | Chen et al. .................. 364/498 |
| 5,872,040 | * | 2/1999 | Wojnarowski et al. .................. 438/393 |
| 5,900,633 | * | 5/1999 | Solomon et al. .................. 250/339.08 |
| 5,913,102 | * | 6/1999 | Yang .................. 438/14 |
| 6,133,132 | * | 10/2000 | Toprac et al. .................. 438/595 |

OTHER PUBLICATIONS

I. Jolliffe, "Principal Component Analysis," pp. 147–155 (Springer–Verlag 1986).

P. Geladi & B. Kowalski, "Partial Least–Squeares Regression: A Tutorial," Analytica Chimica Acta, vol. 185, pp. 1–9 (1986).

* cited by examiner

*Primary Examiner*—Randy Gulakowski
*Assistant Examiner*—Jiri Smetawa
(74) *Attorney, Agent, or Firm*—Ratner & Prestia; Tiffany L. Townsend, Esq.

(57) ABSTRACT

A process for estimating a critical dimension of a trench formed by etching a substrate. First, a regression model is constructed for estimating the critical dimension, in which principal component loadings and principal component scores are also calculated. Next, a substrate is etched and spectral data of the etching are collected. A new principal component score is then calculated using the spectral data and the principal component loadings. Finally, the critical dimension of the trench is estimated by applying the new principal component score to the regression model.

19 Claims, No Drawings

REACTIVE ION ETCH LOADING MEASUREMENT TECHNIQUE

TECHNICAL FIELD

The present invention relates generally to reactive ion etching and, more specifically, to a method of estimating the critical dimension of a trench etched in a substrate.

BACKGROUND OF THE INVENTION

Lithography is a technique used for integrated circuit fabrication in which a silicon slice is coated uniformly with a radiation-sensitive film, the resist, and an exposing source (such as light, x-rays, or an electron beam) illuminates selected areas of the surface through an intervening master template for a particular pattern. Although well known for use in the manufacture of semiconductors, lithography has a broad range of industrial applications. Such applications include, for example, flat-panel displays, micro-machines, and disk heads.

The lithographic process allows for a mask or reticle pattern to be transferred via spatially modulated light (the aerial image) to a photoresist film on a substrate. Those segments of the absorbed aerial image, whose energy exceeds a threshold energy of chemical bonds in the photoactive component of the photoresist material, create a latent image in the photoresist. In some photoresist systems, the latent image is formed directly by the photoactive component. In others, called acid-catalyzed photoresists, the photochemical interaction first generates acids which react with other photoresist components during a post-exposure bake to form the latent image. In either case, the latent image marks the volume of photoresist material that either is removed during the development process (in the case of positive photoresist) or remains after development (in the case of negative photoresist) to create a three-dimensional pattern in the photoresist film.

The principal determinant of the photoresist image is the surface on which the exposure energy equals the photoresist threshold energy in the photoresist film. "Exposure" and "focus" are the variables that control the shape of this surface. Set by the illumination time and intensity, exposure determines the average energy of the aerial image per unit area. Local variations in exposure can be caused by variations in substrate reflectivity and topography. Set by the position of the photoresist film relative to the focal plane of the imaging system, focus determines the decrease in modulation relative to the in-focus image. Local variations in focus can be caused by variations in substrate film thickness and topography.

Generally, because of variations in exposure and focus, patterns developed by lithographic processes must be continually monitored or measured to determine if the dimensions of the patterns are within acceptable ranges. The importance of such monitoring increases considerably as the resolution limit, which is usually defined as the minimum feature size that can be resolved, of the lithographic process is approached. The patterns being developed in semiconductor technology are generally in the shape of lines, both straight and with bends, having a length dimension equal to and multiple times the width dimension.

The width dimension, which by definition is the smaller dimension, is on the order of 0.1 micron to greater than 1 micron in many of the advanced semiconductor technology. Because the width dimension is the minimum dimension of the patterns, it is the width dimension that challenges the resolution limits of the lithographic process. In this regard, because width is the minimum and most challenging dimension to develop, it is the width dimension that is conventionally monitored to access performance of the lithographic process and is referred to as the "critical dimension."

There are a variety of dry etch process types, including reactive ion etching (RIE), physical sputtering, and plasma etching. RIE is a conventional method used to pattern a substrate. RIE combines a physical basis (ion) and a chemical basis. In processes that rely predominantly on the physical mechanism of sputtering, the strongly directional nature of the incident energetic ions allows substrate material to be removed in an isotropic manner (i.e., essentially vertical etch profiles are produced). Unfortunately, such material removal mechanisms are also non-selective against masking material and materials underlying the layers being etched. Thus, the selectivity depends largely on sputter yield differences between materials. Because the sputter yields for most materials are within a factor of three of each other, selectivities are typically inadequate. Moreover, because the ejected species are not inherently volatile, redeposition and trenching can occur. Another problem with pattern transfer by physical sputtering involves the redeposition of nonvolatile species on the side walls of the etched feature. Consequently, dry etch processes for pattern transfer based on physical removal mechanisms have not found wide use in very large scale integrated circuit or VLSI (i.e., more than 100,000 devices per chip) fabrication processes.

In contrast, dry processes relying on chemical mechanisms for etching can exhibit high selectivities against both mask and underlying substrate layers. Such purely chemical etching mechanisms typically etch, however, in an isotropic fashion. Although some applications in VLSI fabrication (such as photoresist stripping in oxygen plasmas) use such processes, the problem of undercutting associated with isotropic etching remains.

By adding a physical component to a purely chemical etching mechanism, the shortcomings of both sputter-based and chemical dry etching processes can be overcome. Dry etch processes based on a combination of physical and chemical mechanisms offer the potential of controlled anisotropic etching together with adequate selectivity. Therefore, RIE is a preferred dry etch process.

The step of reactive ion etching a substrate is typically followed by a final critical dimension measurement operation. That operation measures the metrology of the etched substrate to confirm proper etch performance. Conventional etch performance monitoring uses a scanning electron microscope (SEM). SEM metrology has very high resolving power and is capable of resolving features on the order of 0.1 micron.

Unfortunately, the process of measuring the critical dimension of an etch using SEM metrology suffers from several drawbacks. First, a SEM is very expensive, requiring a tremendous capital expenditure. SEM metrology is also very slow in operation, typically requiring five minutes or more to analyze a reactive ion etched substrate. Furthermore, SEM metrology is difficult to automate because it requires a time consuming pattern recognition step.

As a result of these deficiencies, analysis using scanning electron microscopy is typically done on a single substrate per batch of, for instance, twenty four substrates. It is impractical to use SEM metrology to analyze all substrates in a particular batch. Thus, analysis of the performance of a reactive ion etch on a substrate using scanning electron microscopy suffers from several drawbacks.

The deficiencies of the use of a SEM to measure RIE performance show that a need exists for a technique for monitoring RIE performance that is less expensive to implement, faster in operation, and easier to automate than existing processes.

SUMMARY OF THE INVENTION

To meet this and other needs and to overcome the shortcomings of conventional RIE performance measurements, a new technique is provided. An object of the present invention is to provide a technique for evaluating the performance of a RIE process that is less expensive, faster in operation, and easier to automate than measurement using a scanning electron microscope.

To achieve these and other objects, and in view of its purposes, the present invention provides a process for estimating the critical dimension of a trench formed by etching a substrate. In a first step of the process, a regression model is constructed for estimating a critical dimension. Next, a substrate is etched and spectral data of the etching are collected. A new principal component score is then calculated from the spectral data. The critical dimension is then estimated by applying the new principal component score to the regression model.

To construct the regression model, a first substrate is etched to form a desired critical dimension. During this etching step, spectral data of the etching are collected. A second substrate is also etched to form a critical dimension which differs from the desired critical dimension. During etching of the second substrate, spectral data are again collected. Principal component loadings and scores are then calculated by performing a principal component analysis on the spectral data collected during the etching of the first and second substrates. The regression model is then constructed using the principal component scores, in which the regression model correlates the desired critical dimension to the principal component scores.

It is to be understood that both the foregoing general description and the following detailed description are exemplary, but are not restrictive, of the present invention.

DETAILED DESCRIPTION OF THE INVENTION

In accordance with the present invention, a process for estimating the critical dimensions of patterns (e.g., trenches) formed in semiconductor device manufacturing is provided. In this process, estimation of the critical dimension of a trench that is reactive ion etched in a substrate is performed in situ. Thus, estimation is done during reactive ion etching of the substrate itself.

To implement the invention, a regression model is first constructed. Regression models are conventionally used by those skilled in the art to model the relation between varying data sets and the variable to be modeled. More specifically, regression analysis describes the nature of the relationship between two or more variables: the value of the dependent variable is estimated or described on the basis of one or more independent variables. In the present invention, a regression model is constructed for use in the process of estimating the critical dimension of a trench formed by etching a substrate.

Construction of the regression model used in the technique of the present invention comprises the following steps. First, a trench having the desired critical dimension is formed in a substrate. The term "desired critical dimension" refers to the desired width of a trench formed by etching. Confirmation of the attainment of the desired critical dimension can be obtained, for instance, by cracking the substrate after etching the trench and measuring the cross section of the substrate using a scanning electron microscope, thereby obtaining the metrology of the trench.

After forming a trench having the desired critical dimension, the next step in constructing a regression model comprises forming at least one other trench having a critical dimension which differs from the desired critical dimension, referred to as the "differing critical dimension." The critical dimension of the differing critical dimension is selected to be larger or smaller than the desired critical dimension, for instance 5–25% larger or 5–25% smaller. Confirmation of the attainment of the selected differing critical dimension can be obtained, for instance, by cracking the substrate after etching the trench and measuring the cross section of the substrate using a scanning electron microscope, thereby obtaining the metrology of the trench.

Preferably, several trenches each having a differing critical dimension from that of the desired critical dimension are formed. For example, trenches having critical dimensions which are 10% greater, 25% greater, 10% less, and 25% less than the desired critical dimension can be used. In a preferred embodiment, four trenches having differing critical dimensions of 10% greater, 25% greater, 10% less, and 25m% less than the desired critical dimension are formed. The trenches are formed by reactive ion etching a substrate. Typically, reactive ion etching of a substrate occurs in a reactive ion etch chamber. The substrate is selected from those substrates conventionally used, such as wafers formed of silicon or gallium arsenide.

The next step in constructing the regression model comprises again etching the desired critical dimension in a substrate and simultaneously collecting spectral data of the etching. Similarly, each of the trenches having a differing critical dimension is etched in a substrate and spectral data of each etching are collected. The spectral data collected comprise, for example, optical emission spectra, residual gas analyzer spectra, laser induced fluorescence spectra, or RF harmonic spectra.

These spectral data provide information about the critical dimensions of the trenches. For example, when optical emission spectra are collected, a data set consisting of 1024 values is collected. These 1024 values correspond to properties of the trench that has been etched in the substrate. As a result, trenches having varying critical dimensions will likewise have differing spectral data.

Not all of the obtained spectral data provides insight, however, as to the differing critical dimensions of the trenches. Therefore, it is desirable to use only the spectral data that differentiate the critical dimensions of differing trenches. Identification of such data can be done by using principal component analysis, a process in which those corresponding data values having the greatest variation are selected, and producing principal component scores and principal component loadings. Examples of principal component analysis in regression are provided by I. Jolliffe in a book titled "Principal Component Analysis," pages 147–55 (1986).

For example, when the spectral data collected are optical emission spectra, 1024 values of spectral data are collected. Of these 1024 values, it is desirable to select from about 5 to about 15 loadings which have the greatest variation between the spectra collected of a desired critical dimension and that collected from differing critical dimensions. The number of principal component loadings that are selected depends on the desired percentage of variation between the spectra data that one wishes to capture. Preferably, principal component loadings are selected which capture at least about 90% of the variation.

The spectral data are collected using a data collection device. The spectral data collected comprise, for example, residual gas analyzer spectra, laser induced fluorescence spectra, or RF harmonic spectra. In a preferred embodiment, the spectral data collected are optical emission spectra and the data collection device is an optical emission spectrometer. The data collection device that is used depends on the desired spectral data being collected. For example, if the desired spectral data to be collected are optical emission spectra, then an optical emission spectrometer is preferably used as the data collection device. Preferably, the data collection device is attached to a window of the reactive ion chamber.

After the principal component scores and loadings are obtained, a regression model is next constructed. The regression model is a matrix equation constructed by correlating the principal component scores (S) and critical dimension (Y), which are matrix variables, with a set of matrix coefficients ($\beta_0$ and $\beta_1$). The regression model is represented by the formula:

$$Y = \beta_0 + \beta_1 \cdot S$$

Having obtained the desired and differing critical dimensions, and the principal component scores, the regression model can be constructed using conventional techniques. A tutorial explaining how to build a regression model using principal components is described by P. Geladi & B. Kowalski, "Partial Least-Squares Regression: A Tutorial," Analytica Chimica Acta, vol. 185, pages 1–9 (1986).

Having constructed a regression model, the next step of the process of the present invention comprises reactive ion etching a substrate to form a trench and simultaneously obtaining spectral data of the etching. The spectral data (X) collected during etching of the substrate are used to calculate a new principal component score ($S_{new}$). The new principal component score ($S_{new}$) is equal to the principal component loadings (L) times the spectral data (X):

$$S_{new} = L \cdot X$$

In calculating the new principal component score, those principal component loadings that capture a predetermined percentage variation among spectral data collected in forming the regression model are used to calculate the new principal component score. For example, to capture 90% of the variation in the spectral data, five principal component loadings might be chosen.

After calculating the new principal component score, the next step in the process of the present invention is to apply the new principal component score to the regression model to estimate the critical dimension of the trench formed. Thus, one can estimate the critical dimension of a trench in situ, i.e., while etching the substrate. Having estimated the critical dimension of a trench, it is often desirable to compare the critical dimension to that of the desired critical dimension, and to discard those trenches which fall outside a given tolerance. This step is done, for example, in the processing of a batch of substrates undergoing etching.

One method of determining whether a given critical dimension falls within the set tolerance is the statistical process test. As conventionally used, a statistical process test determines whether an actual result falls within an acceptable deviation from the desired result. The process of determining whether the critical dimension of a trench is within an acceptable deviation from the desired critical dimension comprises the following steps. First, a tolerance from the desired critical dimension is set. Tolerance is defined as the maximum amount of permissible deviation of the critical dimension from the desired critical dimension. The tolerance can be calculated using the following equation:

$$(|Y^2_{predicted} - Y^2_{desired}|)^{0.5} < T,$$

in which $Y_{desired}$ represents the desired critical dimension, $Y_{actual}$ represents the critical dimension, and T represents the tolerance. A trench formed by etching a substrate passes the statistical process test if the result of $(|Y^2_{predicted} - Y^2_{desired}|)^{0.5}$ is less than the tolerance (T).

Although illustrated and described above with reference to specific embodiments, the invention is nevertheless not intended to be limited to the details shown. Rather, various modifications may be made in the details within the scope and range of equivalents of the claims and without departing from the spirit of the invention.

What is claimed is:

1. A process for estimating a critical dimension of a trench formed by etching a substrate, said process comprising the steps of:
   (a) constructing a regression model for estimating said critical dimension, wherein during construction of said regression model principal component loadings and principal component scores are calculated;
   (b) etching said substrate and simultaneously collecting spectral data of said etching;
   (c) calculating a new principal component score from said spectral data and said principal component loadings; and
   (d) estimating said critical dimension by applying said new principal component score to said regression model;
   wherein said step (a) of constructing a regression model comprises:
   (i) etching a first substrate to form a desired critical dimension and simultaneously collecting spectral data of said etching;
   (ii) etching a second substrate to form a differing critical dimension and simultaneously collecting spectral data of said etching;
   (iii) calculating principal component loadings and principal component scores by analyzing the spectral data collected in (i) and (ii) using principal component analysis; and
   (iv) forming a regression model using said principal component scores such that said regression model correlates said desired critical dimension to said principal component scores.

2. The process of claim 1 wherein step (ii) occurs before step (i).

3. The process of claim 1 wherein said principal component loadings capture a predetermined percentage variation between the spectral data collected in step (i) and step (ii).

4. The process of claim 3 wherein said predetermined percentage variation is at least about 90%.

5. A process for estimating a critical dimension of a trench formed by etching a substrate, said process comprising the steps of:
   (a) constructing a regression model for estimating said critical dimension, wherein during construction of said regression model principal component loadings and principal component scores are calculated;

(b) etching said substrate and simultaneously collecting spectral data of said etching;

(c) calculating a new principal component score from said spectral data and said principal component loadings, and calculating said new principal component score from said spectral data comprises multiplying said principal component loadings times said spectral data to calculate said new principal component score, and (d) estimating said critical dimension by applying said new principal component score to said regression model.

6. The process of claim 5 wherein said substrate is selected from the group consisting of silicon and gallium arsenide.

7. The process of claim 1 wherein said first substrate and said second substrate are selected from the group consisting of silicon and gallium arsenide.

8. The process of claim 5 wherein said etching is reactive ion etching.

9. The process of claim 1 wherein said etching is reactive ion etching.

10. The process of claim 8 wherein said reactive ion etching occurs in a reactive ion etch chamber having a window and wherein a data collection device is attached to said window.

11. The process of claim 9 wherein said reactive ion etching occurs in a reactive ion etch chamber having a window and wherein a data collection device is attached to said window.

12. The process of claim 5 wherein said spectral data collected in step (b) are optical emission spectra.

13. The process of claim 11 wherein said spectral data collected in steps (i) and (ii) are optical emission spectra.

14. The process of claim 5 wherein said spectral data collected in step (b) are selected from the group consisting of residual gas analyzer spectra, laser induced fluorescence spectra, and RF harmonic spectra.

15. the process of claim 1 wherein said spectral data collected in steps (i) and (ii) are selected from the group consisting of residual gas analyzer spectra, laser induced fluorescence spectra, and RF harmonic spectra.

16. The process of claim 5 wherein said step of collecting spectral data of said etching in step (b) comprises using a data collection device.

17. The process of claim 1 wherein said step of collecting spectral data of said etching in steps (i) and (ii) comprises using a data collection device.

18. The process of claim 16 wherein said data collection device is an optical emission spectrometer and said spectral data are optical emission spectra.

19. the process of claim 17 wherein said data collection device is an optical emission spectrometer and said spectral data are optical emission spectra.

* * * * *

UNITED STATES PATENT AND TRADEMARK OFFICE
CERTIFICATE OF CORRECTION

PATENT NO.     : 6,268,226 B1                                                Page 1 of 1
DATED          : July 31, 2001
INVENTOR(S)    : David Angell et al.

It is certified that error appears in the above-identified patent and that said Letters Patent is hereby corrected as shown below:

Title page,
Item [56], References Cited, OTHER PUBLICATIONS, delete "Least-Squeares" and insert -- Least-Squares --;

Column 8,
Line 3, delete "11" and insert -- 1 --.

This certificate supersedes Certificate of Correction issued May 28, 2002.

Signed and Sealed this

Tenth Day of December, 2002

JAMES E. ROGAN
*Director of the United States Patent and Trademark Office*